(12) United States Patent
Uhlaender

(10) Patent No.: US 8,756,398 B2
(45) Date of Patent: Jun. 17, 2014

(54) PARTITIONING PAGES OF AN ELECTRONIC MEMORY

(75) Inventor: Gregor Uhlaender, Aachen (DE)

(73) Assignee: Synopsys Inc., Mountain View, CA (US)

( * ) Notice: Subject to any disclaimer, the term of this patent is extended or adjusted under 35 U.S.C. 154(b) by 618 days.

(21) Appl. No.: 13/030,153

(22) Filed: Feb. 18, 2011

(65) Prior Publication Data

US 2012/0215962 A1 Aug. 23, 2012

(51) Int. Cl.
*G06F 13/00* (2006.01)
*G06F 13/28* (2006.01)

(52) U.S. Cl.
USPC .... 711/173; 711/103; 711/162; 711/E12.084; 711/E12.103

(58) Field of Classification Search
None
See application file for complete search history.

(56) References Cited

U.S. PATENT DOCUMENTS

2010/0070686 A1\* 3/2010 Mergler et al. ............... 711/103

\* cited by examiner

*Primary Examiner* — Eric S Cardwell
(74) *Attorney, Agent, or Firm* — Baker Botts L.L.P.

(57) ABSTRACT

A method of partitioning a page of an electronic memory includes creating a first sub-page by interleaving a first user data section of the page with another section of a spare area of the page excluding a specified address in a section of the spare area that stores a bad block marker. The method also includes creating the sub-pages by interleaving the user data sections with sections of the spare area excluding the specified address until a last sub-page is to be created. Further, the method includes creating the last sub-page by interleaving a last user data section with the section of the spare area that includes the specified address in an interleaving sequence that retains the bad-block marker at the specified address.

20 Claims, 3 Drawing Sheets

PARTITIONING PAGES OF AN ELECTRONIC MEMORY

TECHNICAL FIELD

Embodiments of the disclosure relate to partitioning pages of an electronic memory.

BACKGROUND

A non-volatile memory is an electronic memory that retains data when power is inactivated. A NAND flash memory is a favored non-volatile memory for storage media due to higher density, faster access time, and lower cost than other non-volatile memories. Techniques of manufacturing the non-volatile memory are not perfect, and as a result the non-volatile memory often has defective memory cells. Such defective memory cells are referred to as bad blocks. There is no way to repair the bad blocks after the non-volatile memory has been fabricated and the non-volatile memory is usually shipped with a bad-block marker indicating the defective memory cells. The bad-block marker is used by a host system to ensure that data is not written to or read from the bad blocks.

Pages in the non-volatile memory are partitioned into sub-pages of user bytes, out-of-band data bytes, and error correcting code (ECC) parity bytes. The bad-block marker is located in the out-of-band data bytes to mark the bad blocks. The user bytes, the out-of-band data bytes, and the ECC parity bytes are usually protected by error correcting codes. Partitioning in the non-volatile memory is usually performed to achieve low-latency decoding and minimum intermediate buffering. In existing methods of partitioning, pages in the non-volatile memory are partitioned into the sub-pages or ECC code words. An original location of the bad-block marker gets overwritten in such methods and the bad-block marker gets re-positioned within a page. Since the bad-block marker resides in a different position, re-building of a bad-block table becomes tedious and time-consuming as software requires distinguishing between used blocks and unused blocks in the non-volatile memory.

Hence, there is a need for an improved method of partitioning pages of an electronic memory into ECC code words in order to prevent the bad-block marker from being moved, and to allow immediate building and maintenance of the bad block table.

SUMMARY

An example of a method of partitioning a page of an electronic memory includes creating a first sub-page of a plurality of sub-pages by interleaving a first user data section of a plurality of user data sections of the page with another section of a spare area of the page of the electronic memory excluding a specified address in a section of the spare area that stores a bad block marker. The method also includes creating the plurality of sub-pages by interleaving the plurality of user data sections with a plurality of sections of the spare area excluding the specified address until a last sub-page of the plurality of sub-pages is to be created. Further, the method includes creating the last sub-page of the plurality of sub-pages by interleaving a last user data section of the plurality of user data sections with the section of the spare area that includes the specified address in an interleaving sequence that retains the bad-block marker at the specified address.

An example of a system for partitioning a page of an electronic memory includes the electronic memory. The electronic memory includes a plurality of data storage units, each having an address of a plurality of addresses. The plurality of addresses defines a page of the electronic memory. A first set of the plurality of addresses is reserved for user bytes, a second set of the plurality of addresses is reserved for out-of-band (OOB) data bytes, and a third set of the plurality of addresses is reserved for error correcting code (ECC) parity bytes. The electronic memory also includes a bad-block marker at a specified address in the second set of the plurality of addresses. The system also includes an error correcting circuit operable to form a plurality of sub-pages by interleaving the user bytes from the first set of the plurality of addresses with the OOB data bytes from the second set of the plurality of addresses and the ECC parity bytes from the third set of the plurality of addresses. One sub-page of the plurality of sub-pages includes a last portion of the user bytes, a portion of the ECC parity bytes, and a portion of the OOB data bytes which includes the bad-block marker. Further, the system includes a control circuit operable to store in the plurality of data storage units the one sub-page including that portion of the OOB data bytes which includes the bad-block marker such that the bad-block marker is retained at the specified address, and to store other sub-pages of the plurality of sub-pages in contiguous locations.

An example of an electronic device includes an electronic memory and a controller. The electronic memory includes a page that is defined by a plurality of addresses reserved for user bytes, out-of-band (OOB) data bytes, and error correcting code (ECC) parity bytes. A bad-block marker is stored at a specified address reserved for the OOB data bytes. The electronic memory also includes a plurality of data storage units. The controller is in electrical communication with the electronic memory. The controller includes a memory controller and a central processing unit. The memory controller transfers data to and from the electronic memory and includes an error correcting circuit and a control unit. The error correcting circuit is operable to form a plurality of sub-pages by interleaving the user bytes with the OOB data bytes and the ECC parity bytes. One sub-page of the plurality of sub-pages includes a last portion of the user bytes, a portion of the ECC parity bytes, and a portion of the OOB data bytes which includes the bad-block marker. The control circuit is operable to store in the plurality of data storage units the one sub-page including the portion of the OOB data bytes which includes the bad-block marker such that the bad-block marker is retained at the specified address, and to store other sub-pages of the plurality of sub-pages in contiguous locations. Further, the central processing unit is in electrical communication with the memory controller to enable transfer of the data.

BRIEF DESCRIPTION OF THE VIEWS OF DRAWINGS

In the accompanying figures, similar reference numerals may refer to identical or functionally similar elements. These reference numerals are used in the detailed description to illustrate various embodiments and to explain various aspects and advantages of the present disclosure.

DETAILED DESCRIPTION OF THE EMBODIMENTS

Figure 1:
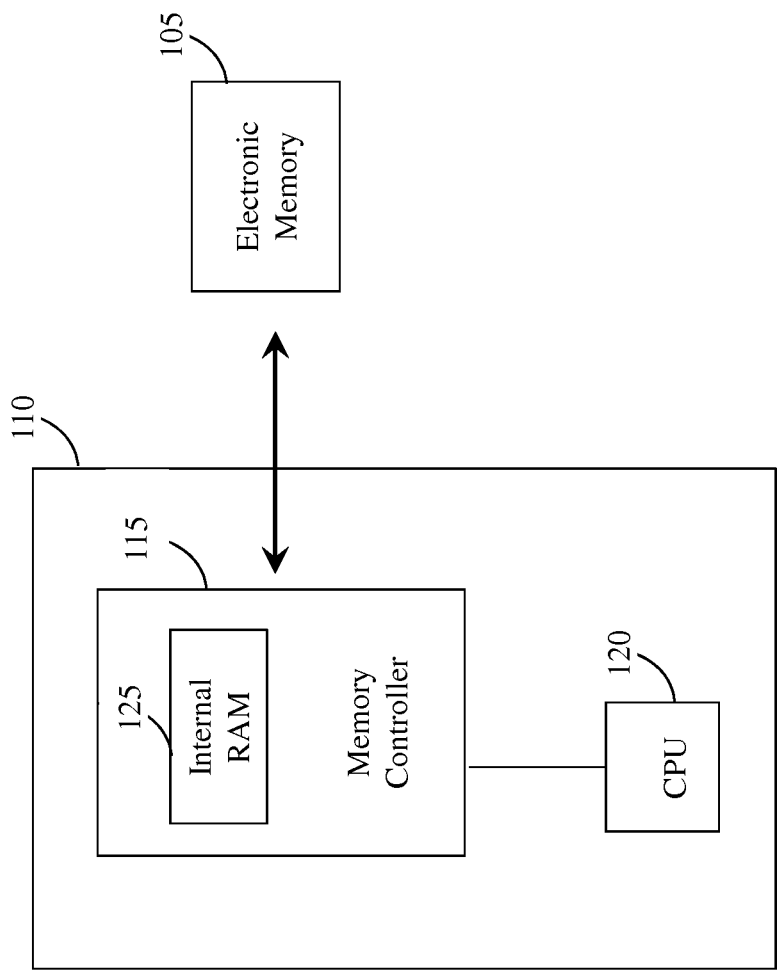
FIG. 1 is a block diagram of a system, in accordance with one embodiment.

FIG. 1 is a block diagram of a system 100, for example an electronic device 100, in accordance with one embodiment. The electronic device 100 includes an electronic memory 105, for example a NAND flash memory, and a controller 110. Examples of the electronic device include, but are not limited to, music players, personal digital assistants, digital cameras and universal serial bus flash drives. The electronic memory 105 can be one of an embedded memory or a non-embedded memory. The controller 110 includes a memory controller 115 and a central processing unit (CPU) 120. The controller 110 can be one of an embedded controller or a non-embedded controller. The memory controller 115 further includes an internal random access memory (RAM) 125. In some embodiments, the internal RAM 125 is external to the memory controller 115 and within the controller 110. The electronic memory 105 interfaces to the CPU 120 through the memory controller 115. To read data from the electronic memory 105, the CPU 120 issues a read command to the memory controller 115. The memory controller 115 transfers data from a requested location in the electronic memory 105 to the internal RAM 125 and performs error detection and error correction. The CPU 120 then reads the data from the internal RAM 125. Similarly, to write data to the electronic memory 105, the CPU 120 issues a write command to the memory controller 115 and transfers data to the internal RAM 125. The memory controller 115 performs error correcting code (ECC) encoding and transfers data from the internal RAM 125 to a requested location in the electronic memory 105.

The electronic memory 105 performs read, write, and erase operations. The electronic memory 105 is divided into a plurality of logical units. Each logical unit is defined as a logical division of the electronic memory 105 and includes a plurality of blocks. Each block is associated with the erase operations. Each block of the electronic memory 105 is of a similar size and includes a plurality of pages. In one example, the block can include 64 pages of 2 KB each. Each page is associated with the read operations and the write operations. A page in the electronic memory 105 includes a data area and a spare area. The data area includes user bytes and the spare area includes OOB data bytes and ECC parity bytes. A bad-block marker is located within the OOB data bytes. The page is divided into a plurality of data storage units or sectors. Each of the data storage units has an address of a plurality of addresses. The addresses define the page of the electronic memory 105. The page is further partitioned into a plurality of sub-pages.

A first set of the addresses in the data storage units are reserved for the user bytes, a second set of the addresses are reserved for the OOB data bytes, and a third set of the addresses are reserved for the ECC parity bytes. The bad-block marker is stored at a specified address in the second set of the addresses.

The spare area includes information to help perform bad-block management and error correction. The spare area includes the ECC parity bytes that are used to perform the error detection and the error correction. An ECC allows the data to be checked for errors and corrected during read operations from the electronic memory 105. Simple ECCs can detect and correct single bit errors. However as some memories trend towards multi-level cell architectures and smaller lithographies, there is a need to perform multiple bit correction as error probabilities increase. ECC is generally performed by dedicated hardware within or next to the memory controller 115 although software ECC is also possible. Several ECC algorithms, for example Hamming Code algorithm, BCH (Bose, Chaudhuri, Hocquenghem) algorithm, and Reed-Solomon algorithm, are available to correct and detect the single-bit errors and the multi-bit errors. ECC algorithms further vary in complexity and corresponding impact on design cost.

In some embodiments, the spare area includes a page state and a logical page number corresponding to the data stored in the data area. Each page can be in one of three different states: (i) valid state (ii) invalid state and (iii) free or erased state. When no data has been written to the page, the page is in the free or erased state. The write operation can be performed only to the free page and the page then changes to the valid state. The erase operation on an entire block of pages is required to revert the pages back to the free or erased state. Out-of-place updates result in certain written pages that are no longer valid. Such pages are in the invalid state. Bad blocks can also cause the pages to be in the invalid state.

The electronic device 100 can also include an error correcting circuit (not shown) and a control circuit (not shown) to enable the partitioning.

The error correcting circuit is operable to receive the user bytes, the OOB data bytes and the ECC parity bytes to further enable the error detection and the error correction. The error correcting circuit receives the user bytes and the OOB data bytes for write operations, and creates the ECC parity bytes that are stored in the electronic memory 105. The error correcting circuit further includes a parity generation circuit, a parity checker, an error locator, and an error correcting unit. The parity generation circuit performs ECC encoding for write operations to the electronic memory 105. The parity checker, also referred to as an error detector, performs error detection for the read operations from the electronic memory 105. For the read operations, the parity checker regenerates the ECC parity bytes, using the parity generation circuit, from the user bytes and the OOB data bytes that are received by the error correcting circuit. The ECC parity bytes thus regenerated are then compared with the ECC parity bytes that are received by the error correcting circuit. The error locator, used for the read operations, calculates location of errors and correction values based on the error detection of the parity checker. The error correcting unit further corrects the errors that are located for the read operations.

In some embodiments, the error correcting circuit can be located internal to the memory controller 115, external to the memory controller 115, or in the electronic memory 105. Functions of the error correcting circuit can also be implemented using a processor in the electronic memory 105.

The control circuit, which can be located in the memory controller 115, is operable to form the sub-pages by interleaving the user bytes from the first set of the addresses with the OOB data bytes from the second set of the addresses and ECC parity bytes from the third set of the addresses. One sub-page of the sub-pages includes a last portion of the user bytes, a portion of the ECC parity bytes, and a portion of the OOB data bytes which includes the bad-block marker. The control circuit is further operable to store in the data storage units the one sub-page having the portion of the OOB data bytes which includes the bad-block marker such that the bad-block marker is retained at the specified address. The control circuit also stores other sub-pages in contiguous locations.

Figure 2:
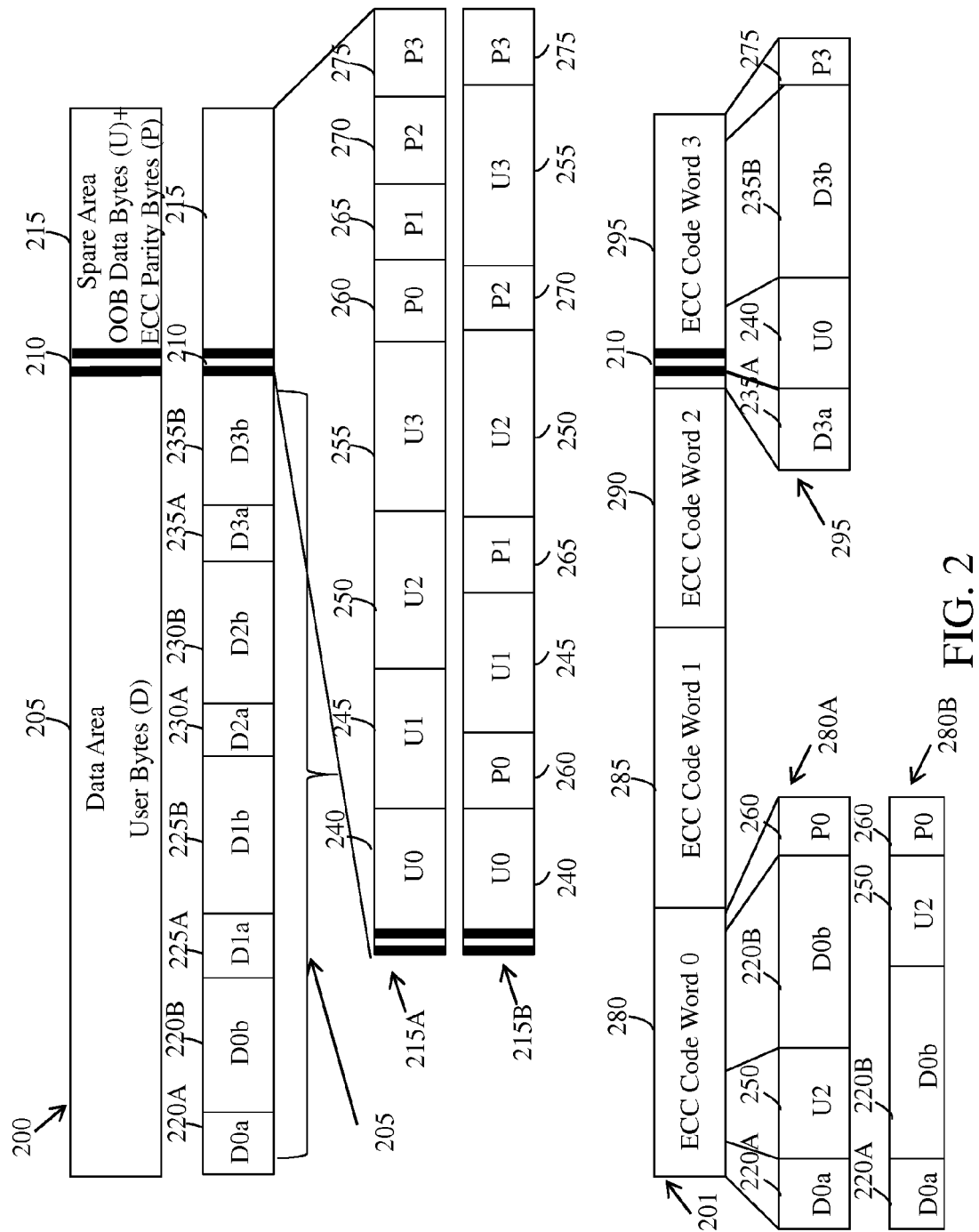
FIG. 2 illustrates partitioning pages of an electronic memory, in accordance with one embodiment.

The partitioning of the page is explained in conjunction with FIG. 2.

FIG. 2 illustrates partitioning a page 200 of an electronic memory, for example the electronic memory 105, in accordance with one embodiment.

The partitioning of the page 200 of the electronic memory into sub-pages, as illustrated in a page 201, allows one sub-page to be read while performing error detection and error correction of a preceding sub-page, and allows one sub-page to be written while performing parity generation of a successive sub-page, thereby reducing overall latency.

A bad block can be defined as an area that includes non-recoverable errors. Presence of the bad blocks causes the data to be written into a next good block. In some embodiments, the bad blocks can be replaced with good blocks by writing the data that has to be written into the bad blocks into the good blocks and creating a bad-block table. The bad-block table can be created by mapping logical addresses to physical addresses.

The bad blocks can be classified into intrinsic bad blocks and acquired bad blocks. Blocks that become defective during manufacturing of the electronic memory 105 are defined as the intrinsic bad blocks. The blocks that become defective during use are defined as the acquired bad blocks of the electronic memory 105.

Information regarding the bad blocks and other related information are typically stored in the bad-block table. The bad-block table is optionally stored in a good block of the electronic memory 105 or created again during booting. If the bad-block table is created during booting, it is required to set the bad-block marker for the acquired bad blocks.

The page 200 is partitioned into the data area 205 and the spare area 215. Such a partitioning is used in the electronic memory 105, during manufacturing, and at an interface between a memory controller and a CPU, for example the memory controller 115 and the CPU 120. The data area 205 includes user bytes and the spare area 215 includes OOB data bytes and ECC parity bytes. A bad-block marker 210 is located within the OOB data bytes. The user bytes are used for application data and the OOB data bytes are used for marking bad blocks in one or more pages of the block, storing ECC parity bytes, and storing file system specific information. The ECC parity bytes are created by the parity generation circuit during write operations and are used for error detection and error correction during read operations. The OOB data bytes and the ECC parity bytes are placed sequentially after the user bytes. The ECC parity bytes can be generated by an error correcting circuit that is located within or next to a memory controller, for example the memory controller 115.

The user bytes of the data area 205 can be partitioned into different data storage units or sectors. For example, the user bytes can be partitioned into sectors D0*a* 220A, D0*b* 220B, D1*a* 225A, D1*b* 225B, D2*a* 230A, D2*b* 230B, D3*a* 235A, and D3*b* 235B, the number of sectors depending on page size and ECC code word size.

The OOB data bytes and the ECC parity bytes in the spare area 215 can be partitioned into different sectors in multiple ways, for example a spare area 215A and a spare area 215B. In one example, the spare area 215A is partitioned into sectors of the OOB data bytes U0 240, U1 245, U2 250, and U3 255, and sectors of the ECC parity bytes P0 260, P1 265, P2 270, and P3 275. In another example, the OOB data bytes and the ECC parity bytes in the spare area 215 can be interleaved with each other to represent the spare area 215B, which is partitioned into the sectors of the OOB data bytes and the ECC parity bytes U0 240, P0 260, U1 245, P1 265, U2 250, P2 270, U3 255, and P3 275.

When the page 200 is read from or written to the electronic memory 105, the data can be interleaved or de-interleaved to obtain sub-pages that correspond to ECC code words to further represent the page 201. In FIG. 2, the page 201 is partitioned into four ECC code words, for example ECC code word 0 280, ECC code word 1 285, ECC code word 2 290, and ECC code word 3 295. A first sector of the OOB data bytes, U0 240, includes the bad-block marker 210 and is placed as part of protected data of the last ECC code word 3 295. The ECC code word 3 295 then includes sectors D3*a* 235A, U0 240, D3*b* 235B, and P3 275. Similarly, other ECC code words can be formed with the OOB data bytes and the ECC parity bytes interleaved between two sections of the user bytes from the data area 205. In one example, the ECC code word 0 280 can be partitioned to represent a first ECC code word 0 280A including sectors D0*a* 220A, U2 250, D0*b* 220B, and P0 260. In another example, the ECC code word 0 280 can be partitioned to represent a second ECC code word 0 280B including sectors D0*a* 220A, D0*b* 220B, U2 250, and P0 260. The last ECC code word, for example the ECC code word 3 295 can be split into two parts and size of the two parts is selected such that the sector U0 240 of the OOB data bytes is placed starting at a nominal OOB start address, for example address 2048 in a 2 KB page, such that the sector U0 240 remains in place with respect to the nominal page partitioning of the page 200.

The last ECC code word or a last sub-page, for example the ECC code word 3 295, that includes the bad-block marker 210 can be stored in the data storage units or the sectors by a control circuit such that the bad-block marker 210 is retained at a specified address.

In some embodiments, the partitioning of the page 201 can be created by the memory controller 115 if the memory controller 115 includes a hardware ECC engine and local storage. In case of software ECC or a separate hardware ECC next to the memory controller 115, the partitioning of the page 201 can be created by the software ECC or the hardware ECC.

In other embodiments, the partitioning of the page 201 can be created when the data is transferred between the memory controller 115 and system memory, for example by using a direct memory access (DMA) controller with linked lists (not shown).

In order to provide the data with minimum latency, it is beneficial to have complete ECC code words stored sequentially in the electronic memory 105 as shown in the page 201. This allows the memory controller 115 to perform a sequential read of an entire page where ECC decoding and correction can begin after the first ECC code word 280 has been transferred.

Figure 3:
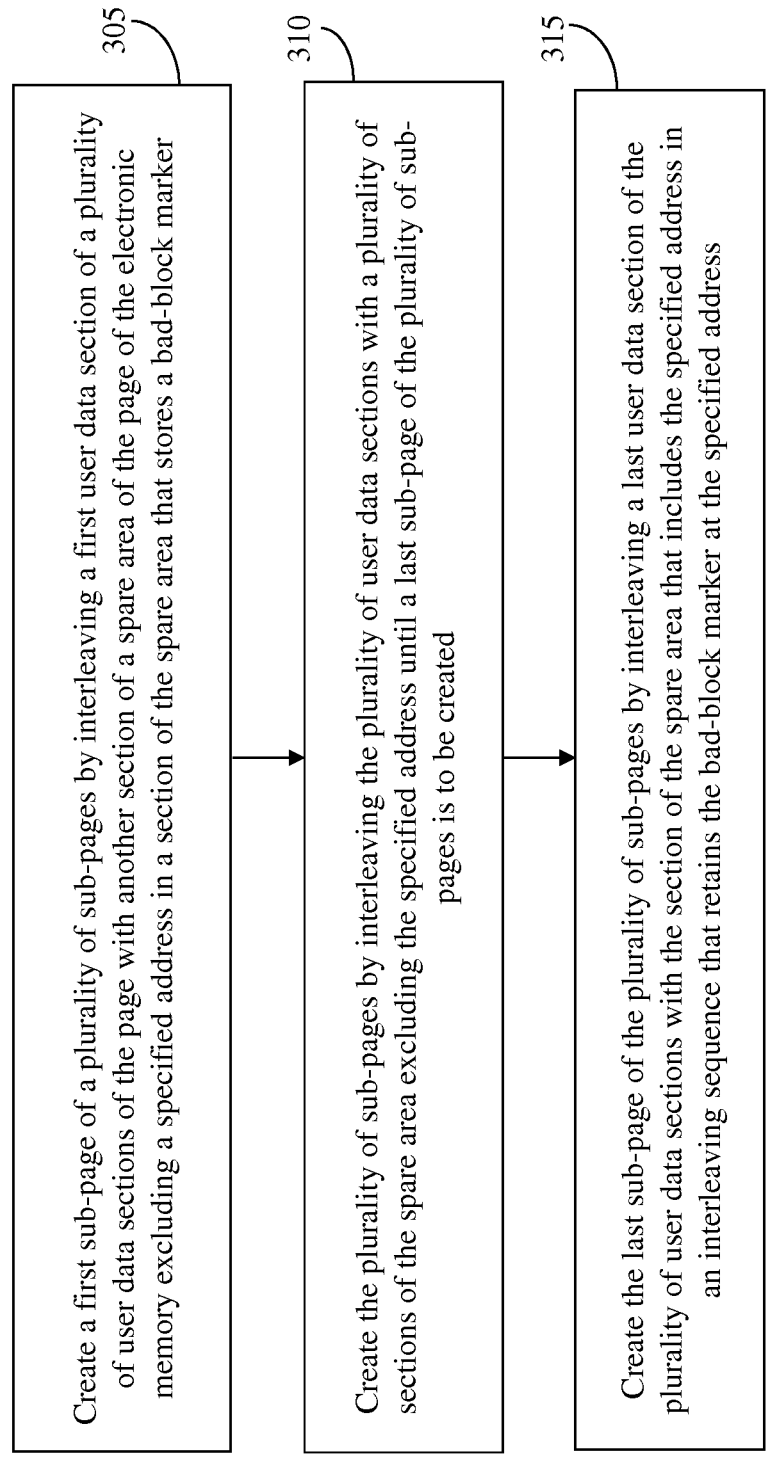
FIG. 3 is a flow diagram illustrating a method of partitioning pages of an electronic memory, in accordance with one embodiment.

FIG. 3 is a flow diagram illustrating a method of partitioning pages of an electronic memory, for example the electronic memory 105. A page in the electronic memory 105 is partitioned into a data area and a spare area. The spare area can also be referred to as an out-of-band (OOB) area.

The electronic memory includes a bad-block marker, for example the bad-block marker 210, stored at a specified address in a section of the spare area, for example a sector U0 240 of the OOB data bytes in the spare area 215, of a page of the electronic memory.

At step 305, a first sub-page of a plurality of sub-pages is created by interleaving a first user data section of a plurality of user data sections of the page with another section of the spare area excluding the specified address. The data area includes user bytes that are partitioned into different sectors. The spare area includes OOB data bytes and the error correcting code (ECC) parity bytes that are also partitioned into different sectors. The OOB data bytes and the ECC parity bytes are both interleaved in each of the sub-pages. In one example, the page is partitioned into four sub-pages or ECC code words. The first sub-page or a first ECC code word, for example the ECC code word 0 280, is created by interleaving the first user data section, for example sectors of the user bytes D0*a* 220A and D0*b* 220B, with the section of the spare area excluding the specified address, for example a sector of the OOB data bytes U2 250, and a sector of the ECC parity bytes P0 260. The first sub-page is hence arranged as D0a 220A, U2 250, D0b 220B, and P0 260 to form the ECC code word 0 280.

At step 310, the sub-pages are created by interleaving the user data sections with a plurality of sections of the spare area excluding the specified address until a last sub-page of the sub-pages is to be created. In one example, a second sub-page or a second ECC code word, for example the ECC code word 1 285, is created by interleaving a second user data section, for example sectors of the user bytes D1a 225A and D1b 225B, with the section of the spare area excluding the specified address, for example a sector of the OOB data bytes U1 245, and a sector of the ECC parity bytes P1 265. The second sub-page is hence arranged as D1a 225A, U1 245, D0b 225B, and P1 265 to form the ECC code word 1 285. Similarly, the third sub-page or a third ECC code word, for example ECC code word 2 290, is created by interleaving a third user data section, for example sectors of the user bytes D2a 230A and D2b 230B, with the section of the spare area excluding the specified address, for example a sector of the OOB data bytes U3 255, and a sector of the ECC parity bytes P2 270. The third sub-page is hence arranged as D2a 230A, U3 255, D2b 230B, and P2 270 to form the ECC code word 2 290.

At step 315, the last sub-page of the sub-pages is created last in time by interleaving a last user data section of the user data sections with the section of the spare area that includes the specified address in an interleaving sequence that retains the bad-block marker at the specified address. The last sub-page of the sub-pages is a fourth sub-page or a last ECC code word. The fourth sub-page or the last ECC code word, for example the ECC code word 3 295, can be created by interleaving a fourth user data section, for example sectors of the user bytes D3a 235A and D3b 235B, with the section of the spare area that includes the specified address, for example the sector of the OOB data bytes U0 240, and a sector of the ECC parity bytes P3 275. The fourth sub-page is hence arranged as D3a 235A, U0 240, D3b 235B, and P3 275 to form the ECC code word 3 295. The bad-block marker is hence stored at the specified address in U0 240. Such partitioning of the page of the electronic memory retains the bad-block marker at the specified address.

In some embodiments, one or more of the OOB data bytes and the ECC parity bytes in the spare area that are stored at specified addresses can be retained at the specified addresses.

The partitioning of the page of the electronic memory into ECC code words and retention of the bad-block marker at the specified address prevents overwriting original bad-block markers for blocks that are already programmed. The partitioning also allows achieving a low read latency by starting the ECC error detection and correction when a first sub-page has been read from the electronic memory, for example the electronic memory 105. Likewise, amount of intermediate buffering of data, for example size of the internal RAM 125 in the memory controller 115, is minimized. Re-building of a bad-block table is also simplified as the bad-block markers are located at the specified address for each block, no matter whether the block has already been programmed. The partitioning also allows re-programming of electronic memories using offline programmers.

In the foregoing discussion, the term "coupled" refers to either a direct electrical connection between the devices connected or an indirect connection through intermediary devices.

The foregoing description sets forth numerous specific details to convey a thorough understanding of embodiments of the disclosure. However, it will be apparent to one skilled in the art that embodiments of the disclosure may be practiced without these specific details. Some well-known features are not described in detail in order to avoid obscuring the disclosure. Other variations and embodiments are possible in light of above teachings, and it is thus intended that the scope of disclosure not be limited by this Detailed Description.

What is claimed is:

1. A method comprising:
    partitioning a page of an electronic memory, wherein the partitioning comprises partitioning a contiguous set of user data bytes into a plurality of addressable sectors and partitioning a contiguous set of out-of-band (OOB) data bytes and ECC parity bytes into a plurality of addressable sectors for the OOB data bytes and a plurality of addressable sectors for the ECC parity bytes, and wherein a bad-block marker is stored at a specified address for one of the addressable sectors for the OOB data bytes; and
    creating each sub-page of a plurality of sub-pages of the page by interleaving the addressable sectors of the user data bytes with the addressable sectors of the OOB data bytes and the addressable sectors of the ECC parity bytes, wherein each sub-page includes (1) at least one addressable sector of the user data bytes, (2) at least one addressable sector of the OOB data bytes, and (3) at least one addressable sector of the ECC parity bytes, and wherein the bad-block marker is retained at the specified address.

2. The method of claim 1, wherein the electronic memory comprises a non-volatile memory.

3. The method of claim 2, wherein the electronic memory comprises a NAND flash memory.

4. The method of claim 1, wherein the last sub-page of the plurality of sub-pages is created last in time.

5. The method of claim 1, wherein the last sub-page of the plurality of sub-pages is created prior in time to at least one sub-page of the plurality of sub-pages.

6. The method of claim 1 and further comprising interleaving a plurality of ECC parity bytes in each of the plurality of sub-pages.

7. The method of claim 1, wherein the plurality of sub-pages comprises a plurality of error correcting code words.

8. A system comprising:
    an electronic memory comprising a plurality of bytes, wherein the bytes comprise a contiguous set of user data bytes and a contiguous set of out-of-band (OOB) data bytes and error correcting code (ECC) parity bytes, wherein a bad-block marker is located at a specified address;
    an error correcting circuit operable to:
        partition the contiguous set of user data bytes into a plurality of addressable sectors and partition the contiguous set of out-of-band (OOB) data bytes and ECC parity bytes into a plurality of addressable sectors; and
        create a plurality of sub-pages of the page by interleaving the addressable sectors of the user data bytes with the addressable sectors of the OOB data bytes and the addressable sectors of the ECC parity bytes, wherein each sub-page includes (1) at least one addressable sector of the user data bytes, (2) at least one addressable sector of the OOB data bytes, and (3) at least one addressable sector of the ECC parity bytes, wherein the bad-block marker is retained at the specified address; and
    a control circuit operable to store the sub-pages, wherein the bad-block marker is stored at the specified address.

9. The system of claim 8, wherein the electronic memory comprises a non-volatile memory.

10. The system of claim 9, wherein the electronic memory comprises a NAND flash memory.

11. The system of claim 9, wherein the electronic memory interfaces with a central processing unit of a controller using a memory controller.

12. The system of claim 11, wherein the electronic memory and the controller are comprised in an electronic device.

13. The system of claim 8, wherein the OOB data bytes and the ECC parity bytes define a spare area.

14. The system of claim 8, wherein the plurality of sub-pages comprises a plurality of error correcting code words.

15. The system of claim 8, wherein the error correcting circuit and the control circuit is comprised in a memory controller.

16. An electronic device comprising:
   an electronic memory, having a plurality of bytes, wherein the bytes comprise a contiguous set of user data bytes and a contiguous set of out-of-band (OOB) data bytes and error correcting code (ECC) parity bytes, wherein a bad-block marker is stored at a specified address; and
   a controller in electrical communication with the electronic memory, the controller comprising:
      a central processing unit in electrical communication with the memory controller to enable transfer of the data; and
      a memory controller that transfers data to and from the electronic memory, the memory controller comprising:
         an error correcting circuit operable to:
            partition the contiguous set of user data bytes into a plurality of addressable sectors and to partition the contiguous set of out-of-band (OOB) data bytes and ECC parity bytes into a plurality of addressable sectors; and
            create a plurality of sub-pages of the page by interleaving the addressable sectors of the user data bytes with the addressable sectors of the OOB data bytes and the addressable sectors of the ECC parity bytes, wherein each sub-page includes (1) at least one addressable sector of the user data bytes, (2) at least one addressable sector of the OOB data bytes, and (3) at least one addressable sector of the ECC parity bytes, and wherein the bad-block marker is retained at the specified address; and
         a control circuit operable to store the sub-pages, wherein the bad-block marker is stored at the specified address.

17. The electronic device of claim 16 and further comprising:
   retaining one or more of the OOB data bytes and the ECC parity bytes at specified addresses at which the OOB data bytes and the ECC parity bytes are stored.

18. The electronic device of claim 16, wherein the controller comprises an embedded controller.

19. The electronic device of claim 18, wherein the controller comprises an internal random access memory.

20. The electronic device of claim 16, wherein the memory controller comprises an internal random access memory.

* * * * *